US 6,600,369 B2

(12) United States Patent  
Mitzlaff

(10) Patent No.: US 6,600,369 B2
(45) Date of Patent: Jul. 29, 2003

(54) WIDEBAND LINEAR AMPLIFIER WITH PREDISTORTION ERROR CORRECTION

(75) Inventor: James E. Mitzlaff, Arlington Heights, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/008,956

(22) Filed: Dec. 7, 2001

(65) Prior Publication Data

US 2003/0107434 A1 Jun. 12, 2003

(51) Int. Cl.[7] .................................................. H03F 1/26
(52) U.S. Cl. .......................... 330/149; 330/10; 330/136
(58) Field of Search .......................... 330/10, 136, 149, 330/129, 151

(56) References Cited

U.S. PATENT DOCUMENTS

| | | | |
|---|---|---|---|
| 4,453,133 A | | 6/1984 | Travis |
| 4,554,514 A | * | 11/1985 | Whartenby et al. .......... 330/149 |
| 5,570,063 A | * | 10/1996 | Eisenberg .................... 330/149 |
| 5,621,354 A | | 4/1997 | Mitzlaff |
| 5,770,971 A | | 6/1998 | McNicol |
| 5,861,777 A | | 1/1999 | Sigmon et al. |
| 5,886,572 A | * | 3/1999 | Myers et al. ................. 330/10 |
| 5,936,464 A | * | 8/1999 | Grondahl ..................... 330/10 |
| 5,974,041 A | | 10/1999 | Kornfeld et al. |
| 6,157,253 A | | 12/2000 | Sigmon et al. |
| 6,255,906 B1 | | 7/2001 | Eidson et al. |

FOREIGN PATENT DOCUMENTS

| | | |
|---|---|---|
| EP | 1 067 696 A2 | 1/2001 |
| GB | 2 356 993 A | 6/2001 |

* cited by examiner

Primary Examiner—Henry Choe
(74) Attorney, Agent, or Firm—Steven A. May

(57) ABSTRACT

A wideband linear amplification system amplifies an input signal to produce an amplified output signal. An envelope detector determines an envelope detector signal based on the input signal. An amplifier bias controller produces multiple control signals based on the envelope detector signal. A predistortion signal loop modifies the input signal, using a companion amplifier stage, based on a first control signal of the multiple control signals to produce a predistorted input signal that includes a distortion component introduced by the companion amplifier stage. A main amplifier stage amplifies the predistorted input signal to produce the amplified output signal based on a second control signal of the multiple control signals, wherein the distortion component of the predistorted input signal at least partially cancels a distortion component introduced to the amplified output signal by the main amplifier stage.

31 Claims, 5 Drawing Sheets

WIDEBAND LINEAR AMPLIFIER WITH PREDISTORTION ERROR CORRECTION

FIELD OF THE INVENTION

The present invention relates generally to wireless communication devices and in particular to a linear power amplification system of a wireless communication device.

BACKGROUND OF THE INVENTION

Power amplifiers for wireless transmission applications, such as radio frequency (RF) power amplifiers, are utilized in a wide variety of communications and other electronic applications. Ideally, the input-output transfer function of a power amplifier should be linear, with a perfect replica of the input signal, increased in amplitude, appearing at the output of the power amplifier.

In addition, for greater efficiency, various RF systems, such as cellular systems, attempt to run power amplifiers at or near their saturation levels, in which the actual output power of the amplifier is just below its maximum rated power output level. This power output level is generally related to the supply voltage (or supply power) to the power amplifier, such that a greater supply voltage will produce a correspondingly greater output power from the amplifier; for higher power input signals, a correspondingly greater actual power output is required to maintain the amplifier at or near saturation. In various prior art amplifiers, however, the supply voltage to the power amplifier is fixed. Given a typical usage situation in which actual power output from the amplifier may vary by a range of several orders of magnitude, use of a fixed supply voltage is highly inefficient, as output power is often an order of magnitude below its maximum, and the power amplifier is not maintained at or near its saturation levels.

Various techniques have evolved to vary the supply voltage to maintain the power amplifier at or near saturation. One such technique is power supply modulation (PSM) which varies, or modulates, the supply voltage to the power amplifier in order to maintain the power amplifier at or near saturation while the input signal varies over time. For PSM, the supply voltage of the amplifier tracks the input signal variations, typically utilizing a signal detector in conjunction with a tracking power supply. In the prior art, however, the various PSM techniques have generally been limited to narrowband applications, or have poor efficiency characteristics.

For example, one prior art PSM technique, known as "envelope elimination and restoration" (EER), utilizes a limiter to provide an essentially constant drive level to the power amplifier to maintain the amplifier in a hard saturation state and increase efficiency. Use of the limiter, however, greatly expands the bandwidth of the RF signal input to the amplifier and requires very accurate tracking of the input signal envelope, with a power supply switching frequency approximately ten times greater than the bandwidth of the RF input signal. As these switching frequencies increase, the transistors within the tracking power supply become less efficient, resulting in excessive power losses. The resulting bandwidth expansion of the limiter also requires the bandwidth capability of the amplifier to be significantly greater than the input signal bandwidth, limiting the EER configuration to narrow bandwidth applications, such as amplitude modulation (AM) RF broadcasts.

Another prior art PSM technique, known as "envelope tracking," does not utilize the limiter of EER and consequently may be suitable for higher bandwidth applications. Use of envelope tracking, however, introduces significant non-linearities in the output signal of the power amplifier, such as gain distortions, phase distortions, and other voltage parasitics. These non-linearities result in an introduction of an additional magnitude component and phase component to the original signal. If these distortion characteristics are not compensated they will cause intermodulation distortion ("IMD") in multicarrier frequency division multiple access ("FDMA") or time division multiple access ("TDMA") systems, and spectral growth in code division multiple access ("CDMA") systems. The various distortions degrade output signal quality and may have other detrimental effects, such as decreased data throughput.

In order to counteract the distortion introduced to an input signal by a power amplifier in an envelope tracking system, techniques have been developed for injecting a predistortion signal into an input signal's path prior to amplification. The predistortion signal includes components equal and opposite to the distortion introduced by the power amplifier and are designed to cancel the distortion introduced to the input signal by the power amplifier. For example, FIG. 1 is a block diagram of a linear power amplification system 100 of the prior art. The operation of a linear power amplification system such as system 100 is described in detail in U.S. patent application Ser. No. 09/765,747, entitled "High Efficiency Wideband Linear Wireless Power Amplifier," which application is assigned to the assignee of the present invention and is hereby incorporated by reference herein in its entirety. System 100 includes an envelope detector 102, a tracking power supply 104 coupled to the envelope detector, an input signal conditioner apparatus 120, and a power amplifier (PA) 110. Power amplifier 110 is preferably coupled to an antenna (or antenna array) 114 for wireless transmission of an amplified, output signal 112. System 100 also includes first and second delay circuits 106 and 108, respectively.

Envelope detector 102 and tracking power supply 104 are utilized to track a signal 101 input into system 100 and to provide a variable supply voltage 109 to the power amplifier 110. Variable supply voltage 109 is designed to maintain power amplifier 110 at or near saturation and to increase the efficiency of the power amplifier over a wide range of variation of the input signal. However, the variation of the supply voltage 109 supplied to power amplifier 110 causes gain and phase distortions to be introduced to the amplified signal 112 by power amplifier 110.

In order to counteract the gain and phase distortions introduced by power amplifier 110, input signal conditioner apparatus 120 predistorts, or conditions, input signal 101. Input signal conditioner apparatus 120 includes a nonlinear phase mapper 122, a phase adjuster 124, a nonlinear gain mapper 126, and a gain adjuster 128. Variations in gain and phase in the output signal 112 are correlated to, or otherwise occur as, a function of the supply voltage 109 sourced to power amplifier 110. The variations in gain and phase of output signal 112 can be calibrated or otherwise empirically determined as a function of supply voltage 105, 109 to create nonlinear phase and gain mappings that are respectively implemented in nonlinear phase mapper 122 and nonlinear gain mapper 126.

Non-linear phase mapper 122 and non-linear gain mapper 126 are then used to adjust the transfer functions of phase adjuster 124 and gain adjuster 128, respectively, based on the supply voltage 109 sourced to power amplifier 110. By adjusting the transfer functions of phase adjuster 124 and gain adjuster 128, the phase and gain of input signal 101 can be adjusted in such a manner as to counteract the gain and phase distortions introduced to the input signal at varying supply voltages by power amplifier 110.

A problem with a linear power amplification system such as system 100 is that the system provides optimal performance only under the environmental conditions, such as power amplifier 110 age and operating temperatures, at which non-linear mappers 122 and 126 are set up. It is well known in the art that power amplifier performance varies with both an age and an operating temperature of the amplifier. Therefore, there is a need for a linear power amplification system that is more inherently self-aligning, that is, that self-corrects for variations in power amplifier 110 performance due to the effects of age and operating temperature on a power amplifier.

DETAILED DESCRIPTION OF THE INVENTION

Figure 1:
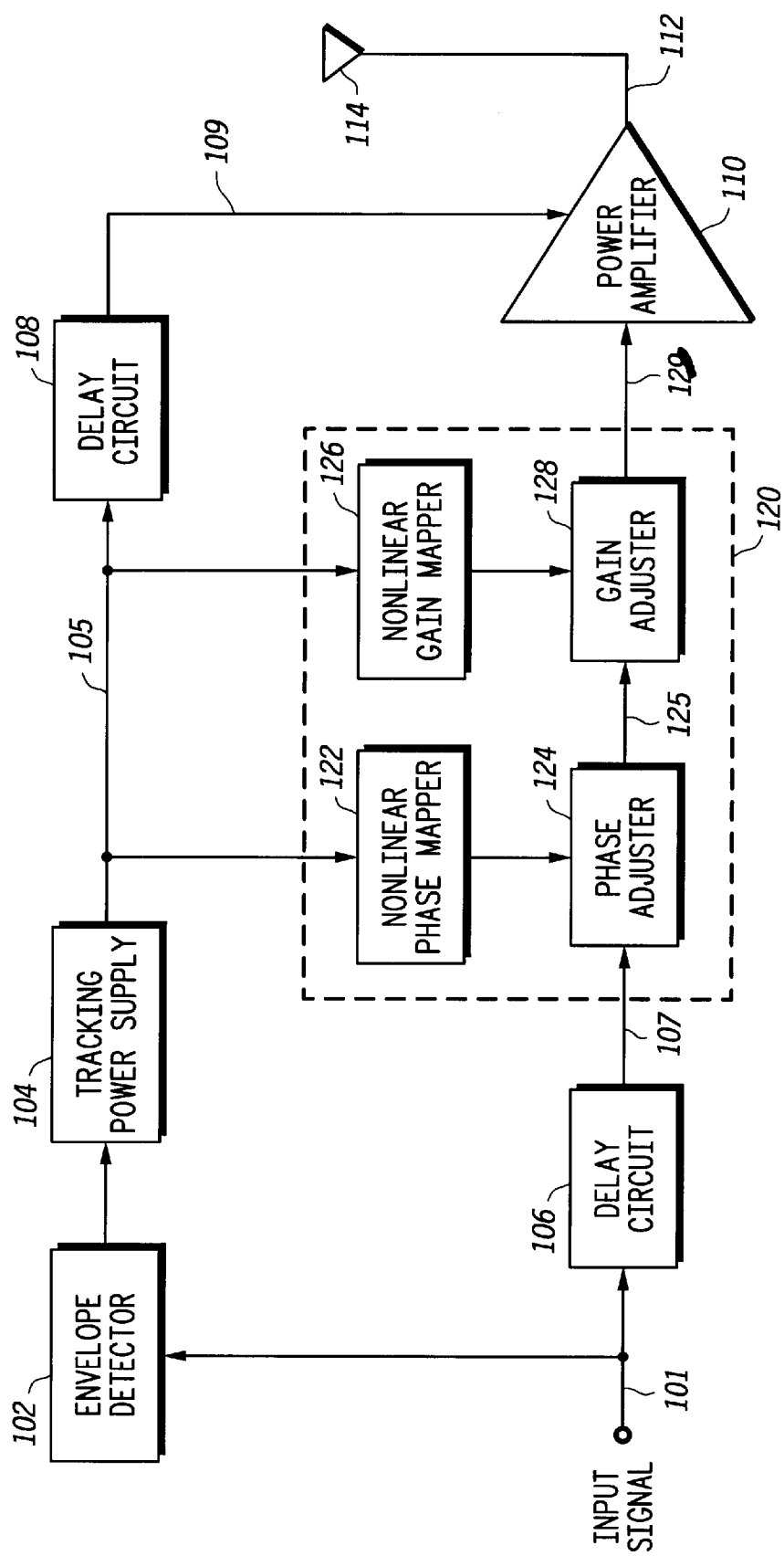
FIG. 1 is a block diagram of a linear power amplification system of the prior art.

To address the need for a linear power amplification system that is more inherently self-aligning, that is, that self-corrects for variations in power amplifier performance due to the effects of age and operating temperature on a power amplifier, a wideband linear amplification system is provided that amplifies an input signal to produce an amplified output signal. An envelope detector determines an envelope detector signal based on the input signal. An amplifier bias controller produces multiple control signals based on the envelope detector signal. A predistortion signal loop modifies the input signal, using a companion amplifier stage, based on a first control signal of the multiple control signals to produce a predistorted input signal that includes a distortion component introduced by the companion amplifier stage. A main amplifier stage amplifies the predistorted input signal to produce the amplified output signal based on a second control signal of the multiple control signals, wherein the distortion component of the predistorted input signal at least partially cancels a distortion component introduced to the amplified output signal by the main amplifier stage.

Generally, one embodiment of the present invention encompasses a linear power amplification system for linear amplification of an input signal to produce an amplified output signal. The system includes an envelope detector, an amplifier bias controller operably coupled to the envelope detector, a predistortion signal loop operably coupled to the amplifier bias controller, and a main amplifier stage operably coupled to each of the amplifier bias controller and the predistortion signal loop. The envelope detector determines an envelope detector signal based on the input signal. The amplifier bias controller produces multiple control signals based on the envelope detector signal. The predistortion signal loop includes a companion amplifier stage and, in response to a first control signal of the multiple control signals, modifies the input signal using the companion amplifier stage to produce a predistorted input signal that includes a distortion component introduced by the companion amplifier stage. The main amplifier stage receives a second control signal of the multiple control signals from the amplifier bias controller and, based on the second control signal, amplifies the predistorted input signal to produce the amplified output signal, wherein the distortion component of the predistorted input signal at least partially cancels a distortion component introduced to the amplified output signal by the main amplifier stage.

Another embodiment of the present invention encompasses a method for linear amplification of an input signal having a carrier component to produce an amplified output signal. The method includes steps of envelope detecting the input signal to determine an envelope detector signal and generating multiple of control signals based on the envelope detector signal. The method further includes steps of sampling the input signal to produce an attenuated input signal and amplifying, by a companion amplifier stage, the attenuated input signal to produce a companion amplifier output signal based on a first control signal of the multiple control signals. The method further includes steps of generating a predistorted input signal based on the companion amplifier output signal, wherein the predistorted input signal comprises a distortion component introduced to the companion amplifier output signal by the companion amplifier stage and amplifying, by a main amplifier stage and based on a second control signal of the multiple control signals, the predistorted input signal to produce an amplified output signal, wherein the distortion component of the predistorted input signal at least partially cancels a distortion component introduced to the amplified output signal by the main amplifier stage.

Yet another embodiment of the present invention encompasses a wireless communication device having an information source, a transmitter operably coupled to the information source and including a companion amplifier stage and a main amplifier stage, and an antenna operably coupled to the transmitter. The information source produces an input signal. The transmitter receives the input signal, samples the input signal to produce an attenuated input signal, modifies the attenuated input signal using the companion amplifier stage to produce a predistorted input signal comprising a distortion component, and amplifies the predistorted input signal to produce an amplified output signal, wherein the distortion component of the predistorted input signal at least partially cancels a distortion component introduced to the amplified output signal by the main amplifier stage. The antenna then transmits the amplified signal.

Figure 2:
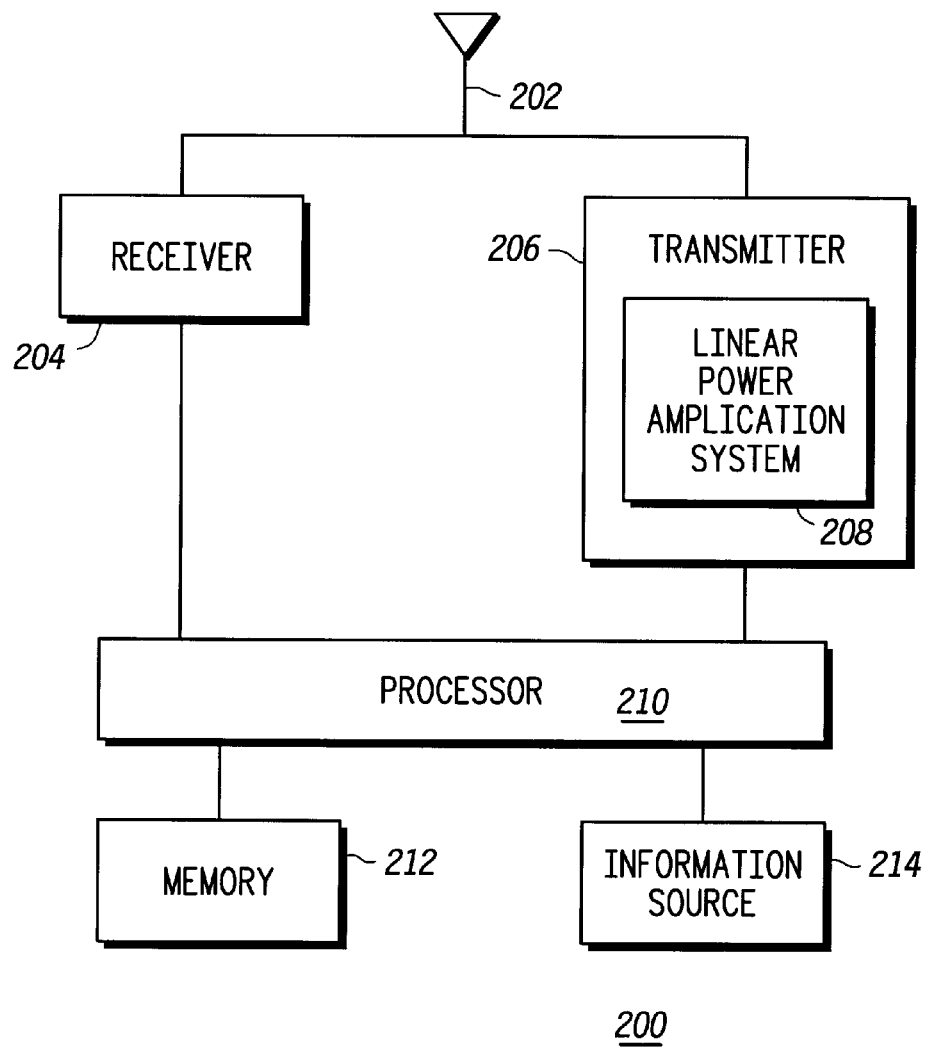
FIG. 2 is a block diagram of a communication device in accordance with an embodiment of the present invention.

The present invention may be more fully described with reference to FIGS. 2–6. FIG. 2 is a block diagram of a communication device 200 in accordance with an embodiment of the present invention. Preferably, communication device 200 comprises a base transceiver station (BTS); however, alternatively communication device 200 may comprise any wireless communication device capable of wirelessly transmitting information, such as a cellular telephone, a radiotelephone, or a wireless modem. Communication device 200 includes an antenna 202 operably coupled to each of a receiver 204 and a transmitter 206. Communication device 200 further includes a processor 210, such as a microprocessor or a digital signal processor (DSP), operably coupled to each of receiver 204 and transmitter 206 and further operably coupled to each of a memory 212 and an information source 214. Memory 212 stores programs executed by processor 210 in the operation of communication device 200. Information source 214 may include an interface with devices or networks external to communication device 200, or in another embodiment of the present invention, such as in the case of a cellular telephone or a radiotelephone, may be a user interface, or in yet other embodiments of the present invention may be included in processor 210 and may be an application running on the processor.

Information source 214 or receiver 204 sources information to processor 210. Processor 210 processes the information in accordance with well-known signal processing techniques and then conveys a signal comprising the processed information to transmitter 206. Transmitter 206 modulates the information onto a radio frequency (RF) carrier to produce an RF signal and routes the RF signal to a linear power amplification system 208 included in the transmitter that amplifies the signal for transmission via antenna 202. In other embodiments of the present invention, one or more components of linear power amplification system 208 may be located external to transmitter 206 in communication device 200.

Figure 3:
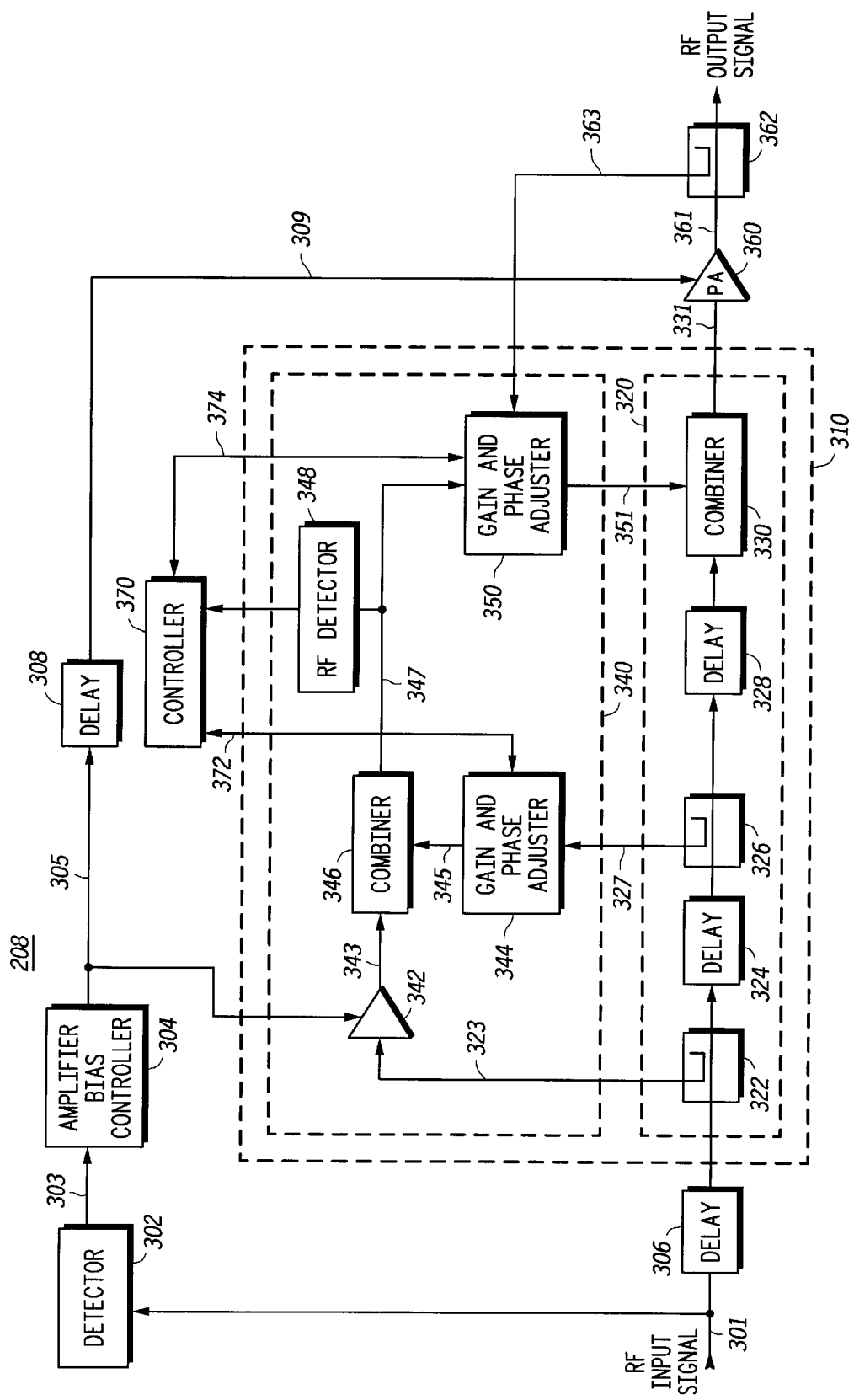
FIG. 3 is a block diagram of the linear power amplification system of FIG. 2 n accordance with an embodiment of the present invention.
Figure 5:
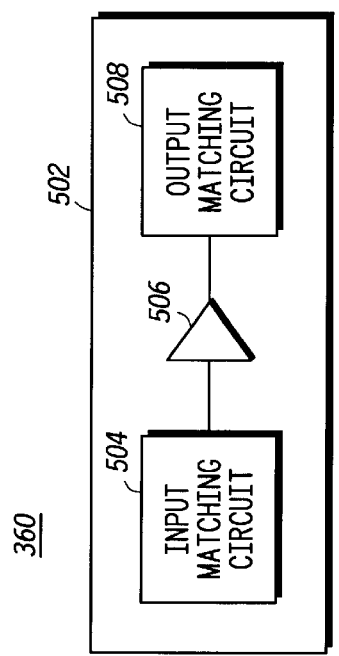
FIG. 5 is a block diagram of a main amplifier stage in accordance with an embodiment of the present invention

FIG. 3 is a block diagram of linear power amplification system 208 in accordance with an embodiment of the present invention. Linear power amplification system 208 includes an envelope detector 302, an amplifier bias controller 304 coupled to the envelope detector, and a main amplifier stage 360 coupled to the amplifier bias controller via a delay circuit 308. Linear power amplification system 208 further includes a predistortion signal loop 310 that is coupled to each of amplifier bias controller 304 and main amplifier stage 360. As depicted in FIG. 5, main amplifier stage 360 includes at least one radio frequency (RF) power amplifier 502 having an RF amplifying element 506 such as a power transistor, respective input and output matching circuits 504 and 508, and biasing and decoupling circuitry as are necessary to allow the functionality of the RF amplifying element and to bias the RF amplifying element class AB; however, those of ordinary skill in the art realize that other biases, such as classes A, B, or C, may be used here without departing from the spirit and scope of the present invention.

An RF signal 301 comprising carrier components is input into linear power amplification system 208. Linear power amplification system 208 routes input signal 301 to envelope detector 302 and to predistortion signal loop 310 via a delay circuit 306. Delay circuit 306 is utilized to delay, and thereby synchronize, a version of input signal 301 that is input into main amplifier stage 360 with a corresponding control signal 309 that is sourced by amplifier bias controller 304 to the main amplifier stage. Envelope detector 302 tracks or detects an envelope of input signal 301 to produce an envelope detector signal 303, typically a voltage. Amplifier bias controller 304 is then utilized to further track (or quantize) the envelope detector voltage or signal 303 and to adjust a control signal 305 that is based on the envelope of input signal 301 and is sourced by the amplifier bias controller to each of main amplifier stage 360 and a "companion" amplifier stage 342.

In one embodiment of the present invention, amplifier bias controller 304 is a tracking power supply and control signal 305 is a supply voltage sourced to main amplifier stage 360 via a delay circuit 308. For faster operation and for greater bandwidth capability, tracking power supply 304 can be stepped or switched, providing a quantized power supply voltage or signal 305. The voltage 305 output by tracking power supply 304 is approximately a stepped or quantized version or replica of the envelope detector voltage 303, and may also include various ringing, overshoot, and other voltage distortions. By tracking input signal 301, envelope detector 302 and tracking power supply 304 provide a variable supply voltage 305 to main amplifier stage 360 and enable the main amplifier stage to be maintained at or near saturation over a wide range of magnitudes of input signal 301, thereby providing for highly efficient amplification of the input signal.

As mentioned above, however, such envelope tracking by the envelope detector 302 and amplifier bias controller 304, to provide a variable supply voltage to main amplifier stage 360, typically introduces significant non-linearities in a signal 361 output by main amplifier stage 360, such as gain distortions and phase distortions. To compensate for the non-linearities, predistortion signal loop 310 modifies input signal 301 to produce a predistorted input signal 331 that is conveyed by predistortion signal loop 310 to main amplifier stage 360. Predistorted input signal 331 includes modifications to input signal 301 that are meant to compensate for and cancel out the distortion introduced by main amplifier stage 360 to signals amplified by the main amplifier stage. Main amplifier stage 360 amplifies predistorted input signal 331 to produce output signal 361. The distortion introduced by main amplifier stage 360 to amplified signal 361 is cancelled out by the modifications to input signal 301 that are implemented by predistortion signal loop 310, with the result that output signal 361 is a very accurate analog replica of input signal 301.

Figure 4:
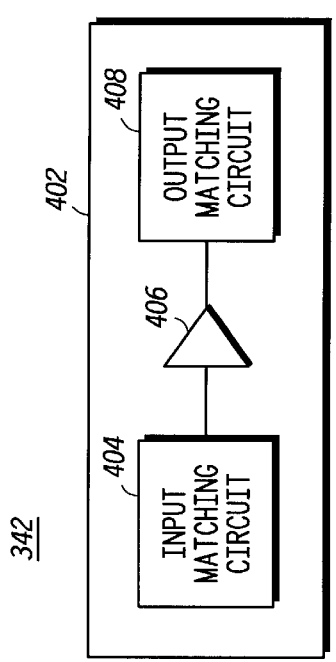
FIG. 4 is a block diagram of a companion amplifier stage in accordance with an embodiment of the present invention.

Predistortion signal loop 310 includes a main signal circuit 320 and a feed forward signal circuit 340. Input signal 301, as delayed by delay circuit 306, is input to main signal circuit 320 and is routed to a first signal coupler 322 included in the main signal circuit. First signal coupler 322, preferably a directional coupler, samples the input signal to produce a first attenuated input signal 323 that is conveyed to "companion" amplifier stage 342, which companion amplifier stage is included in feed forward signal circuit 340. As depicted in FIG. 4, companion amplifier stage 342 includes at least one RF amplifier 402 having an RF amplifying element 406 such as a power transistor, respective input and output matching circuits 404 and 408, and biasing and decoupling circuitry as are necessary to allow the functionality of the RF amplifying element.

First signal coupler 322 also conveys input signal 301 to a second signal coupler 326 in main signal circuit 320 via a first main signal circuit delay circuit 324. Second signal coupler 326, preferably a directional coupler, samples the input signal to produce a second attenuated input signal 327 that is conveyed to a first gain and phase adjuster 344 included in the feed forward signal circuit 340. Second signal coupler 326 also conveys input signal 301 to a signal combiner 330 in main signal circuit 320, preferably a directional coupler, via a second main signal circuit delay circuit 328.

In addition to receiving input signal 301 from second signal coupler 326, signal combiner 330 receives a predistortion signal 351 from feed forward signal circuit 340. Predistortion signal 351 includes distortion components that are a function of control signal 305 sourced by amplifier bias controller 304. The distortion components included in predistortion signal 351 correspond to, and cancel, distortion components introduced to an amplified signal by main amplifier stage 360 due to variations in control signal 305 sourced to the main amplifier stage, regardless of the operating temperature and the age of the at least one RF amplifying element of the main amplifier stage 360. Signal combiner 330 combines predistortion signal 351 with the delayed version of input signal 301 received from second delay circuit 328 to produce a predistorted input signal 331. Predistorted input signal 331 includes the distortion components of predistortion signal 351, which distortion components, as noted above, cancel distortion components introduced to an amplified signal by main amplifier stage 360. As a result, by amplifying predistorted input signal 331, main amplifier stage 360 produces an output signal 361 that is a generally linear, amplified replica, without phase or gain distortions, of the input signal 301 notwithstanding variations in control signal 305 sourced to main amplifier stage 360 or the operating temperature and the age of the at least one RF amplifying element of the main amplifier stage.

Predistortion signal 351 is produced by feed forward signal circuit 340 as follows. As mentioned above, companion amplifier stage 342 in feed forward signal circuit 340 receives attenuated input signal 323 from first signal coupler 322. Companion amplifier stage 342 also receives, from amplifier bias controller 304, at least one control signal 305 that is based on the detected envelope of input signal 301. Based on control signal 305, companion amplifier stage 342 amplifies attenuated input signal 323 to produce a companion amplifier output signal 343.

As noted above, in one embodiment of the present invention control signal 305 comprises a supply voltage that effectuates a similar operating point, for example, a similar quiescent current, for the RF amplifying elements 406, 506 of each of companion amplifier stage 342 and main amplifier stage 360. As a result, ideally, companion amplifier stage 342 will have distortion characteristics identical to main amplifier stage 360. Furthermore, ideally the RF amplifying elements 406, 506 of amplifier stages 342 and 360 are of similar age and are operating at similar temperatures, again resulting in nearly identical distortion characteristics for each amplifier stage. In practice it is unlikely that the distortion characteristics will be identical; however, this is not a problem so long as differences among the RF amplifying elements of the amplifier stages are reasonably small and stable over time and temperature. By sourcing the same control signal 305 to each of companion amplifier stage 342 and main amplifier stage 360, the two amplifier stages will output signals, that is, signals 343 and 361, respectively, with similar distortion characteristics over time and temperature.

Companion amplifier stage 342 conveys companion amplifier output signal 343 to a feed forward signal circuit signal combiner 346, preferably a directional coupler. Signal combiner 346 also receives a gain and/or phase adjusted version of second attenuated input signal 327, that is, signal 345, from first gain and phase adjuster 344. Signal combiner 346 combines gain and/or phase adjusted input signal 345 and companion amplifier output signal 343 to produce a predistortion signal 347. The carrier components of signals 343 and 345 at least partially cancel each other so that predistortion signal 347 is principally comprised of the distortion components introduced to companion amplifier output signal 343 by companion amplifier stage 342. Delay circuit 324 is designed to match the difference in the delay introduced to attenuated input signal 323 by companion amplifier stage 342 and the delay introduced to attenuated input signal 327 by gain and phase adjuster 344, thereby synchronizing the combining of signals 343 and 345 by combiner 346 and optimizing the cancellation of the signals carrier components.

First gain and phase adjuster 344 produces gain and/or phase adjusted input signal 345 by adjusting a gain and/or a phase of second attenuated input signal 327 so as to minimize a power level of predistortion signal 347. By minimizing a power level of predistortion signal 347, gain and phase adjuster 344 optimizes the cancellation of the carrier components of companion amplifier output signal 343 and gain and/or phase adjusted input signal 345.

First gain and phase adjuster 344 adjusts a gain and/or a phase of second attenuated input signal 327 by reference to control signals 372 received from a gain and phase adjuster controller 370, preferably a microprocessor or a digital signal processor (DSP), coupled to gain and phase adjuster 344. An RF detector 348 coupled to controller 370 and to an output of signal combiner 346 detects an RF power of predistortion signal 347. RF detector 348 conveys a signal corresponding to the detected power to controller 370. Based on the detected power, controller 370 conveys multiple control signals 372 to gain and phase adjuster 344. A voltage variable attenuator or a variable gain amplifier (not shown) included in gain and phase adjuster 344 adjusts a gain of attenuated input signal 327 based on a first control signal of the multiple control signals 372. A voltage variable phase shifter (not shown) included in gain and phase adjuster 344 adjusts a phase of signal 327 based on a second control signal of the multiple control signals 372. The gain and/or phase adjusted attenuated input signal 345 is then conveyed to signal combiner 346.

Feed forward signal circuit signal combiner 346 conveys predistortion signal 347 to a second feed forward signal circuit gain and phase adjuster 350. Gain and phase adjuster 350 adjusts the gain and/or phase of predistortion signal 347 to produce a gain and/or phase adjusted predistortion signal 351. Gain and phase adjuster 350 conveys the gain and/or phase adjusted predistortion signal 351 to forward signal circuit signal combiner 330, preferably a directional coupler. As mentioned above, in addition to receiving adjusted predistortion signal 351, signal combiner 330 receives input signal 301 from signal coupler 326 via delay circuit 328. Signal combiner 330 combines gain and/or phase adjusted predistortion signal 351 and the delayed input signal received from delay circuit 328 to produce predistorted input signal 331. Signal combiner 330 then conveys predistorted input signal 331 to main amplifier stage 360. Delay circuit 328 is designed to match the delay introduced to attenuated input signal 327 by gain and phase adjusters 344 and 350, thereby synchronizing the combining of gain and phase adjusted predistortion signal 351 and a delayed version of input signal 301.

Gain and phase adjuster 350 adjusts a gain and/or a phase of predistortion signal 347 so that predistorted input signal 331, which is input into main amplifier stage 360, includes distortion components that correspond to and cancel the distortion components introduced to an amplified signal by main amplifier stage 360. Preferably, this is accomplished by gain and phase adjuster 350 adjusting a gain and/or a phase of predistortion signal 347 so as to minimize a level of distortion, such as out-of-band signals, in output signal 361. In order for gain and phase adjuster 350 to minimize a level of distortion in output signal 361, an output signal coupler 362 coupled to an output of main amplifier stage 360 samples output signal 361 to produce an attenuated output signal 363. Signal coupler 362 conveys attenuated output signal 363 to gain and phase adjuster 350. Gain and phase adjuster 350 determines a level of distortion of attenuated output signal 363 and adjusts a gain and/or a phase of predistortion signal 347 with reference to the determined level of distortion.

The operation of gain and phase adjuster 350 is well known in the art. For example, gain and phase adjuster 350 may comprise a processor (not shown), such as a microprocessor or a digital signal processor (DSP), that implements a spectrum analysis function. The processor translates attenuated output signal 363 to a frequency domain and determines the out-of-band signals included in signal 363. A voltage variable attenuator or a variable gain amplifier (not shown) included in gain and phase adjuster 350 adjusts a gain of predistortion signal 347 and a voltage variable phase shifter (not shown) included in the gain and phase adjuster adjusts a phase of predistortion signal 347 so as to reduce the out-of-band signals included in attenuated output signal 363, and therefore in output signal 361.

Alternatively, the spectrum analysis function may be embodied in gain and phase adjuster controller 370. Gain and phase adjuster 350 may then convey attenuated output signal 363 to controller 370. Controller 370 determines a level of distortion of attenuated output signal 363 and, based on the determined level of distortion, conveys multiple control signals 374 to gain and phase adjuster 350. A voltage variable attenuator or a variable gain amplifier included in gain and phase adjuster 350 adjusts a gain of predistortion signal 347 based on a first control signal of the multiple control signals 374 and a voltage variable phase shifter included in gain and phase adjuster 350 adjusts a phase of predistortion signal 347 based on a second control signal of the multiple control signals 374 so as to reduce the out-of-band signals included in output signal 363.

By way of another example, the operation of a gain and phase adjuster minimizing a level of distortion in an output signal is described in detail in U.S. Pat. No. 5,621,354, which patent is assigned to the assignee of the present invention and is hereby incorporated by reference herein in its entirety.

To accommodate any delay incurred during gain and phase determinations and adjustments by the predistortion signal loop 310, a delay circuit 308 in a path of the at least one control signal 305 is utilized to delay, and thereby synchronize, control signal 305 with the corresponding predistorted input signal 331. The delayed version of the at least one control signal, that is, signal 309, sourced to the main amplifier stage 360 is the same value as the control signal 305, which control signal 305 is sourced to companion amplifier stage 342 and is utilized to predistort attenuated input signal 323 to produce companion amplifier output signal 343. As a consequence, the amplification of predistorted input signal 331 by power amplifier 360, utilizing the synchronized control signal 309, produces an output signal 361 that is a generally linear, amplified replica, without phase or gain distortions, of input signal 301.

In another embodiment of the present invention, an adjustable load embodiment, the output matching circuit 408, 508 of each RF amplifier 402, 502 in companion amplifier stage 342 and main amplifier stage 360 may include an adjustable load circuit. Adjustable load circuits are well known in the art and will not be described in detail. For example, an adjustable load circuit whose load impedance may be adjusted in response to a control signal is described in detail in U.S. Pat. No. 5,060,294, entitled "Dual Mode Power Amplifier for Radiotelephone," which patent is assigned to the assignee of the present invention and is hereby incorporated by reference herein in its entirety. In the adjustable load embodiment, amplifier bias controller 304 preferably is a bias/switch controller and the multiple control signals 305 generated by the amplifier bias controller can be utilized to control the impedance presented to the RF amplifying element 406, 506 of each RF amplifier 402, 502 in addition to, or instead of, adjusting a supply voltage sourced to the RF amplifier. By adjusting an impedance of the load circuit 408, 508 of each RF amplifier 402, 502, amplifier bias controller 304 is able to effectuate a desired operating point for the RF amplifier.

By similarly adjusting the output load circuit 408, 508, and thereby the operating points, of each of the RF amplifiers 402, 502 in companion amplifier stage 342 and the main amplifier stage 360, amplifier bias controller 304 can control the distortion components introduced to an amplified signal by the amplifier stages. As a result, predistortion signal loop 310 can produce a predistortion input signal 331 that includes distortion components that correspond to, and cancel, distortion components introduced to an amplified signal by main amplifier stage 360, regardless of the operating temperature and the age of the RF amplifiers in the main amplifier stage.

In yet another embodiment of the present invention, a multiple load embodiment, the output matching circuit 408, 508 of each RF amplifier 402, 502 of amplifier stages 342 and 360 includes multiple, parallel load circuits. Each RF amplifier 402, 502 then further includes multiple RF switching devices, such as PIN diodes or GASFET switches, wherein each RF switching device of the multiple RF switching devices is coupled between a load circuit of the multiple, parallel load circuits 408, 508 and the RF amplifier's RF amplifying element 406, 506. Each RF switching device is further coupled to amplifier bias controller 304.

In the multiple load embodiment, the multiple control signals 305 generated by amplifier bias controller 304, preferably a bias/switch controller, are conveyed to one or more of the multiple switching devices coupled to the RF amplifying element 406, 506 of each RF amplifier 402, 502. The multiple control signals 305 are then utilized enable or disable a corresponding switching device and to select a particular load from among the multiple loads included in the output matching circuit 408, 508 of each RF amplifier 402, 502. By selecting a particular load from among the multiple loads coupled to an RF amplifying element 406, 506, amplifier bias controller 304 can control the impedance presented to the RF amplifying element 406, 506 of each RF amplifier 402, 502 and thereby effectuate a desired operating point for the RF amplifier. By similarly adjusting the output load circuits 408, 508, and thereby the operating points, of each of the RF amplifiers 402, 502 in companion amplifier stage 342 and the main amplifier stage 360, amplifier bias controller 304 can control the distortion components introduced to an amplified signal by the amplifier stages.

Figure 7:
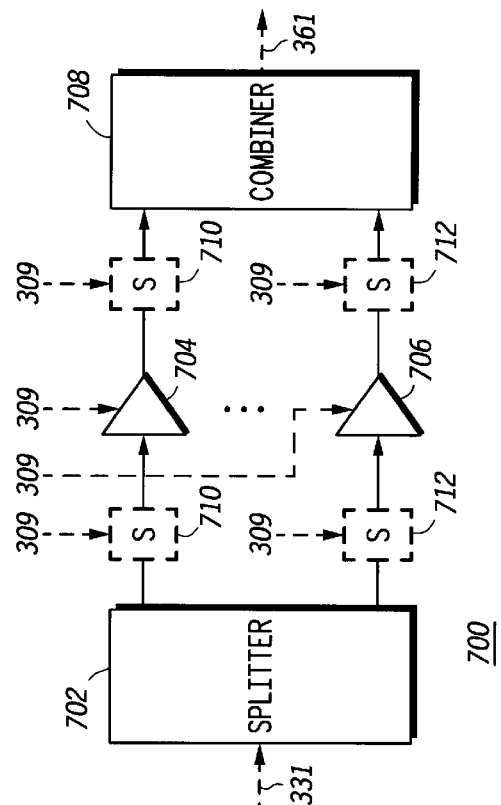
FIG. 7 is a block diagram of a main amplifier stage in accordance with another embodiment of the present invention.
Figure 6:
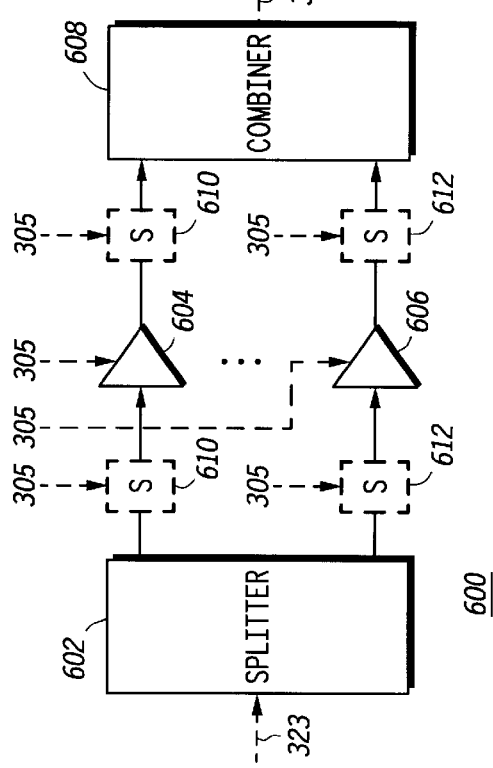
FIG. 6 is a block diagram of a companion amplifier stage in accordance with another embodiment of the present invention.

In still another embodiment of the present invention, a "switched power amplifier" embodiment, the companion amplifier stage and the main amplifier stage each includes multiple RF amplifiers. FIGS. 6 and 7 are block diagrams of a companion amplifier stage 600 and a main amplifier stage 700, respectively, in accordance with the switched power amplifier embodiment. Companion amplifier stage 600 includes multiple, parallel RF amplifiers 604, 606 (two shown) that are each operably coupled to a signal splitter 602 at the amplifier's input and to a signal combiner 608 at the amplifier's output. Similarly, main amplifier stage 700 includes multiple, parallel RF amplifiers 704, 706 (two shown) that are each coupled to a signal splitter 702 at the amplifier's input and a signal combiner 708 at the amplifier's output. Preferably, each of signal splitters 602 and 702 is a hybrid splitter that divides a signal input into their respective amplifier stages 600, 700 equally among each of the multiple RF power amplifiers of the stage, and signal combiners 608 and 708 are each a hybrid combiner.

Referring now to FIGS. 3, 6, and 7, amplifier bias controller 304 preferably is a bias/switch controller and sources multiple control signals 305 to each of companion amplifier stage 600 and, via delay circuit 308, main amplifier stage 700. In one embodiment of the present invention, each control signal of the multiple control signals 305 is coupled to, and utilized by, one of the multiple RF power amplifiers 604, 606, 704, 706 of companion amplifier stage 600 and main amplifier stage 700 to set an operating point of the amplifier. In another embodiment of the present invention, each control signal of the multiple control signals 305 is utilized to switch a corresponding amplifier 604, 606, 704, 706 in or out of a forward path of a signal input into the corresponding amplifier stage (i.e., signal 323 with respect to companion amplifier stage 600 and signal 331 with respect to main amplifier stage 700).

Preferably, each of control signals the multiple control signals 305 is a supply voltage that is based on the detected envelope of input signal 301. By sourcing a supply voltage or a nominal or zero voltage to each of the multiple RF amplifiers 604, 606, 704, 706, amplifier bias controller 304 is able to enable or disable the corresponding amplifier and is further able to effectuate a desired operating point for each enabled amplifier. By effectuating a similar operating point for each enabled amplifier, amplifier bias controller 304 is able to control the distortion components introduced into amplified signals 343 and 361 by companion amplifier stage 600 and main amplifier stage 700, respectively, assuring that similar distortion components are introduced into each amplified signal. As a result and as described above, predistortion input signal 331 produced by predistortion signal loop 310 includes distortion components that correspond to, and cancel, distortion components introduced to an amplified signal by each of the main amplifier stage amplifiers 704, 706 regardless of the operating temperature and the age of the main amplifier stage amplifiers.

In another embodiment of the switched power amplifier embodiment, each of companion amplifier stage 600 and main amplifier stage 700 further includes multiple RF switching devices 610, 612, (two shown) and 710, 712, (two shown) respectively. Each RF switching device 610, 612, 710, 712 is interposed between a respective RF amplifier 604, 606, 704, 706 and a corresponding signal splitter 602, 702 of the corresponding amplifier stage 600, 700. Alternatively, each RF switching device 610, 612, 710, 712 may be interposed between a respective RF amplifier 604, 606, 704, 706 and a corresponding signal combiner 608, 708 of the corresponding amplifier stage 600, 700. Each RF switching device 610, 612, 710, 712 is further coupled to amplifier bias controller 304 and receives a control signal of the multiple control signals 305 from the amplifier bias controller. Each control signal of the multiple control signals 305 is then employed to enable or disable a corresponding RF switching device 610, 612, 710, 712. In addition, each RF amplifier 604, 606, 704, 706 is coupled to a power supply (not shown) that sources a supply voltage to the amplifier.

By enabling and/or disabling selected switching devices 610, 612, 710, 712 via multiple control signals 305 and 309, amplifier bias controller 304 can individually select one or more of the RF amplifiers 604, 606 and 704, 706 respectively included in each of companion amplifier stage 600 and main amplifier stage 700 for amplification of a signal input into the corresponding amplifier stage. By enabling and/or disabling selected switching devices 610, 612, 710, 712 based on the envelope of input signal 301, amplifier bias controller 304 can allocate an appropriate number of amplifiers for amplification of the signal. For example, for a larger detected input signal envelope, amplifier bias controller 304 may couple more of the multiple RF amplifiers 604, 606 and 704, 706 of respective amplifier stages 600, 700 into the path of the respective signals 323, 331, while for a smaller detected input signal envelope, amplifier bias controller 304 may couple fewer of the multiple RF amplifiers 604, 606 and 704, 706 of each amplifier stage into the path of a signal input into the amplifier stage. By allocating an appropriate number of amplifiers in each of amplifier stages 600 and 700, amplifier bias controller 304 is able to control the distortion introduced into each of amplified signals 343 and 361 by respective amplifier stages 600 and 700.

In general, a wireless communication device 200 is provided that includes a linear amplification system 208 for amplification an input signal 301 to produce a linearly amplified output signal 361. An envelope detector 302 included in linear amplification system 208 determines an envelope detector signal 303 based on input signal 301. An amplifier bias controller 304 included in linear amplification system 208 and operably coupled to envelope detector 302 produces multiple control signals 305 based on envelope detector signal 303. A predistortion signal loop 310 operably coupled to amplifier bias controller 304 includes a companion amplifier stage 342. In response to a first control signal of the multiple control signals 305, predistortion signal loop 310 modifies an attenuated version 323 of the input signal using companion amplifier stage 342 to produce a predistorted input signal 331 that includes a distortion component introduced by the companion amplifier stage. A main amplifier stage 360 included in linear amplification system 208 and operably coupled to each of amplifier bias controller 304 and predistortion signal loop 310 receives a second control signal of the multiple control signals 305 from the amplifier bias controller and, based on the second control signal, amplifies predistorted input signal 331 to produce amplified output signal 361. The distortion component of the predistorted input signal 331 at least partially cancels a distortion component introduced to amplified output signal 361 by main amplifier stage 360, thereby linearizing output signal 361.

In one embodiment of the present invention, amplifier bias controller 304 includes a tracking power supply and each control signal of the multiple control signals 305 comprises a supply voltage. The supply voltages may then be used by companion amplifier stage 342 to set a first operating point and by main amplifier stage 360 to set a second operating point. By setting an operating point for companion amplifier stage 342 that has distortion characteristics similar to the distortion characteristics of the operating point set by main amplifier stage 360, a predistorted input signal 331 can be produced by predistortion signal loop 310 that includes a distortion component that at least partially cancels a distortion component introduced to amplified output signal 361 by main amplifier stage 360. Furthermore, ideally RF amplifying elements 406, 506 included in each of amplifier stages 342 and 360 are of similar age and are operating at similar temperatures, with the result that the two amplifier stages will output signals, that is, signals 343 and 361, respectively, with similar distortion characteristics over time and temperature.

In another embodiment of the present invention, amplifier bias controller 304 includes a bias/switch controller and each of the companion amplifier stage and the main amplifier stage respectively includes multiple RF amplifiers 604, 606 and 704, 706. Each RF amplifier 604 and 606 of the companion amplifier stage is coupled to a signal splitter 602 at the amplifier's input and to a signal combiner 608 at the amplifier's output. Similarly, each RF amplifier 704 and 706 of the main amplifier stage is coupled to a signal splitter 702 at the amplifier's input and to a signal combiner 708 at the amplifier's output. Each of the companion amplifier stage and the main amplifier stage respectively further includes multiple switching devices 610, 612 and 710, 712 that may each be coupled between an RF amplifier and a corresponding signal splitter or between an RF amplifier and a corresponding signal combiner.

Each control signal of the multiple control signals 305 is then employed to enable or disable a corresponding RF switching device 610, 612, 710, 712. By enabling and/or disabling selected switching devices 610, 612, 710, 712 via multiple control signals 305, amplifier bias controller 304 can individually select one or more of the RF amplifiers 604, 606, 704, 706 included in each of the companion amplifier stage and the main amplifier stage for amplification of a signal input into the corresponding amplifier stage. By enabling and/or disabling selected switching devices 610, 612, 710, 712 based on the envelope of input signal 301, amplifier bias controller 304 can allocate an appropriate number of amplifiers for amplification of a signal input into each of the companion amplifier and the main amplifier stages, thereby controlling the distortion components introduced to an amplified signal by each stage and the cancellation of distortion components in output signal 361.

Figure 8:
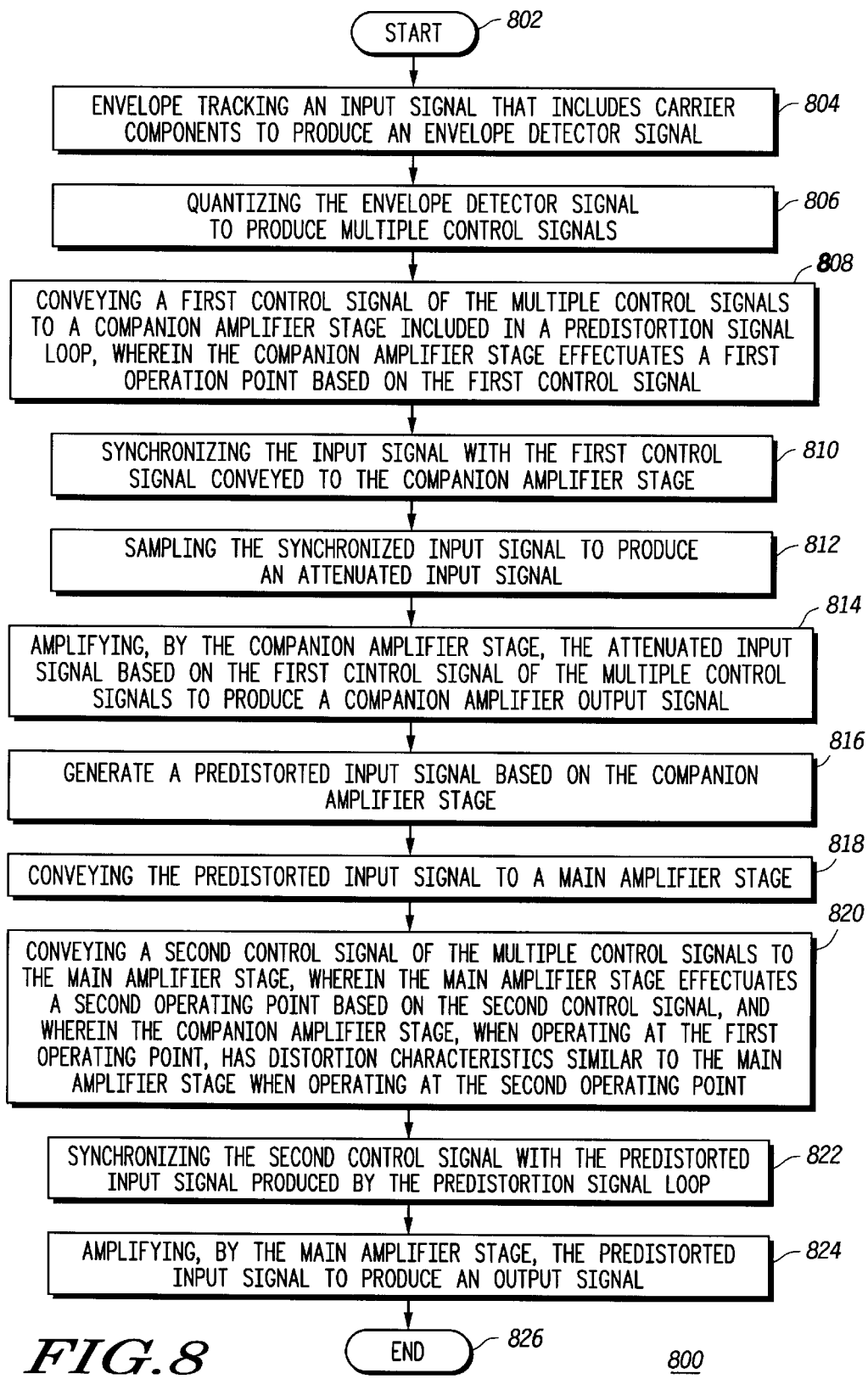
FIG. 8 is a logic flow diagram of the steps performed by a linear power amplification system to correct distortion introduced to an amplified signal in accordance with an embodiment of the present invention.

FIG. 8 is a logic flow diagram 800 of the steps performed by a linear power amplification system to correct distortion introduced to an amplified signal by a main amplifier stage in accordance with an embodiment of the present invention. The linear power amplification system includes an envelope detector, a predistortion signal loop having a companion amplifier stage, and a main amplifier stage coupled to the predistortion signal loop and comprising at least one RF power amplifier. The companion amplifier and each main stage amplifier preferably each includes at least one RF amplifier having an RF amplifying element such as a power transistor, input and output matching circuits, and biasing and decoupling circuitry as are necessary to allow the functionality of the RF amplifying element. The linear power amplification system further includes an amplifier bias controller, such as a tracking power supply or a bias/switch controller, that is coupled to each of the envelope detector, predistortion signal loop, and main amplifier stage and that produces a plurality of control signals capable of controlling the operation of the companion amplifier stage and the main amplifier stage.

Logic flow diagram 800 begins (802) with the envelope detector envelope tracking (804) an input signal that includes carrier components to produce an envelope detector signal, preferably a voltage. The envelope detector signal is quantized (806) by the amplifier bias controller to produce multiple control signals. Each control signal of the multiple control signals may be a supply voltage that is sourced to the companion amplifier or to the main amplifier or may be a voltage utilized to adjust a load of the RF amplifier included in the companion amplifier stage or the RF amplifier included in the main amplifier stage. The amplifier controller then conveys (808) a first control signal of the multiple control signals to the predistortion signal loop, in particular to the companion amplifier stage.

The input signal is synchronized (810), preferably by a first delay circuit coupled to the predistortion signal loop, with the first control signal of the multiple control signals that is sourced to the companion amplifier stage and is sampled (812) to produce an attenuated input signal. Based on the first control signal, the companion amplifier stage amplifies (814) the attenuated input signal to produce a companion amplifier output signal. The predistortion signal loop then generates (816) a predistorted input signal based on the companion amplifier output signal and conveys (818) the predistorted input signal to the main amplifier stage.

The step of amplifying (814) the attenuated input signal to produce an companion amplifier output signal preferably includes the following steps. The input signal is delayed by a first delay circuit and is then sampled by a first signal coupler to produce the attenuated input signal, that is, a first attenuated input signal. First attenuated input signal is conveyed to the companion amplifier stage. The amplifier bias controller conveys the first control signal to the companion amplifier stage and, in response to receiving the first control signal, the companion amplifier stage effectuates an RF amplifier operating point. The first attenuated input signal is then amplified by the companion amplifier stage to produce a companion amplifier output signal.

In one embodiment of the present invention, the step of effectuating an RF amplifier operating point for the companion amplifier stage includes a step of conveying a first control signal that comprises a supply voltage to the at least one RF amplifier included in the companion amplifier stage. In other embodiments of the present invention, the step of effectuating an operating point includes a step of adjusting an output load of an RF amplifying element included in the at least one RF amplifier of the companion amplifier stage based on the first control signal, either by adjusting an adjustable load circuit or by coupling to the RF amplifying element an appropriate output load circuit from among multiple alternative output load circuits, based on the first control signal.

By controlling the operating point of the RF amplifier of the companion amplifier stage, the amplifier bias controller is able to control the distortion components introduced to the companion amplifier output signal by the companion amplifier. By controlling the distortion components of the companion amplifier output signal, the predistortion signal loop can produce a predistorted input signal that includes distortion components that correspond to, and cancel, distortion components introduced to an signal amplified by the at least one RF amplifier included in the main amplifier stage, regardless of the operating temperature and the age of the at least one main amplifier stage RF amplifier.

The step of generating (816) a predistorted input signal then preferably includes the following steps. The input signal is further delayed by a second delay circuit and then is sampled by a second signal coupler to produce a second attenuated input signal. The second attenuated input signal is gain and phase adjusted and is then combined, preferably by a first signal combiner, with the companion amplifier output signal to produce a predistortion signal. The further delay of the input signal by the second delay circuit and the gain and phase adjustment of the second attenuated input signal are designed to optimize carrier cancellation when the gain and phase adjusted second attenuated input signal is combined with the companion amplifier output signal. The result is that the predistortion signal principally includes the distortion components introduced to the companion amplifier output signal by the companion amplifier.

The predistortion signal is then gain and phase adjusted and combined, preferably by a second signal combiner, with a version of the input signal that is even further delayed by a third delay circuit to produce the predistorted input signal. The further delay of the input signal by the third delay circuit is designed to synchronize the combining of the gain and phase adjusted predistortion signal and the version of the input signal delayed by the third delay circuit. The gain and phase adjustment of the predistortion signal is designed to optimize the cancellation, by the predistorted input signal, of the distortion components introduced to a main amplifier stage output signal by the at least one RF amplifier of the main amplifier stage.

The amplifier bias controller also conveys (820) a second control signal of the multiple control signals to the main amplifier stage. In one embodiment of the present invention, based on the second control signal, the main amplifier stage effectuates a second operating point for the at least one RF amplifier of the main amplifier stage. The first and second operating points are such that the at least one RF amplifier of the companion amplifier stage, when operating at the first operating point, has distortion characteristics similar to the at least one RF amplifier of the main amplifier stage when operating at the second operating point. Ideally, the RF amplifiers of the companion amplifier stage and the main amplifying stage each includes RF amplifying elements that are of similar age and are operating at similar temperatures. By setting operating points for each of the RF amplifiers that result in similar distortion characteristics for each RF amplifier, the RF amplifiers will introduce nearly identical distortion components into an amplified signal.

Similar to the step of effectuating a first operating point in the companion amplifier, in one embodiment of the present invention the step of effectuating a second operating point in the at least one RF amplifier of the main amplifying stage includes a step of conveying, by the amplifier bias controller to the RF amplifier, a second control signal that comprises a supply voltage. In other embodiments of the present invention, the step of effectuating a second operating point includes a step of adjusting an output load of an RF amplifying element included in the at least one main amplifying stage RF amplifier based on the second control signal. The output load of the RF amplifier may be adjusted by adjusting an adjustable load circuit or by coupling the RF amplifying element of the RF amplifier to an appropriate output load circuit from among multiple alternative output load circuits.

The second control signal is synchronized (822) with the predistorted input signal produced by the predistortion signal loop by a fourth delay circuit. Based on the second control signal received from the amplifier bias controller, the main amplifier stage amplifies (824) the predistorted input signal to produce a main amplifier stage output signal for transmission via antenna. The distortion introduced to the main amplifier stage output signal by the at least one RF amplifier of the main amplifier stage is cancelled out by the modifications to the input signal that are implemented by the predistortion signal loop in producing the predistorted input signal, with the result that the main amplifier stage output signal is a very accurate analog replica of the input signal. Logic flow 800 then ends (826).

In another embodiment of the present invention, the companion amplifier stage and the main amplifier stage each includes at least one RF switching device that operably couples the at least RF amplifier included in the stage to the signal input into the stage. Each RF switching device is further coupled to the amplifier bias controller. The step of amplifying (814) the attenuated input signal to produce an companion amplifier output signal then further comprises steps of enabling, based on the first control signal, the RF switching device coupled to the at least one companion amplifier stage RF amplifier and coupling the first attenuated input signal to the companion amplifier stage RF amplifier via the enabled switching device. Similarly, the step of amplifying (824) the predistorted input signal then further comprises steps of enabling, based on the second control signal, the switching device coupled to the main amplifier stage RF amplifier and coupling the predistorted input signal to the main amplifier stage RF amplifier via the enabled switching device.

In sum, a system and method is provided for the linear amplification of an input signal to produce an amplified output signal. The linear amplification system includes a predistortion signal loop having a companion amplifier stage. In response to a first control signal of multiple control signals produced by an amplifier bias controller, the companion amplifier stage produces a companion amplifier output signal. The companion amplifier output signal includes a distortion component introduced by the companion amplifier stage and is used to produce a predistorted input signal that is input into a main amplifier stag&. The main amplifier stage then amplifies the predistorted input signal to produce an amplified output signal. The distortion component introduced by the companion amplifier stage at least partially cancels a distortion component introduced to the amplified output signal by the main amplifier stage. By using RF amplifying elements in each of the companion amplifier stage and the main amplifier stage that are of similar age and that are operating at similar temperatures, the two amplifier stages will output signals with similar distortion characteristics over time and temperature, thereby optimizing distortion cancellation over time and temperature.

While the present invention has been particularly shown and described with reference to particular embodiments thereof, it will be understood by those skilled in the art that various changes may be made and equivalents substituted for elements thereof without departing from the spirit and scope of the invention. In addition, many modifications may be made to adapt a particular situation or material to the teachings of the invention without departing from the essential scope thereof. Therefore, it is intended that the invention not be limited to the particular embodiments disclosed herein, but that the invention will include all embodiments falling within the scope of the appended claims.

What is claimed is:

1. A system for linear amplification of an input signal to produce an amplified output signal, the system comprising:

an envelope detector that determines an envelope detector signal based on the input signal;

an amplifier bias controller operably coupled to the envelope detector that produces a plurality of control signals based on the envelope detector signal;

a predistortion signal loop operably coupled to the amplifier bias controller, the predistortion signal loop having a companion amplifier stage and operative, in response to a first control signal of the plurality of control signals, to modify the input signal using the companion amplifier stage to produce a predistorted input signal comprising a distortion component introduced by the companion amplifier stage; and a main amplifier stage operably coupled to the amplifier bias controller and further operably coupled to the to the predistortion signal loop, wherein the main amplifier stage receives a second control signal of the plurality of control signals from the amplifier bias controller and, based on the second control signal, amplifies the predistorted input signal to produce the amplified output signal, and wherein the distortion component of the predistorted input signal at least partially cancels a distortion component introduced to the amplified output signal by the main amplifier stage.

2. The system of claim 1, further comprising a first delay circuit operably coupled to the predistortion signal loop that synchronizes the input signal to the control signal received by the main amplifier stage.

3. The system of claim 2, further comprising a second delay circuit operably coupled between the amplifier bias controller and the main amplifier stage that synchronizes the control signal to the predistorted input signal from the predistortion signal loop.

4. The system of claim 1, wherein the amplifier bias controller further determines each control signal of the plurality of control signals as a substantially quantized version of the envelope detector voltage.

5. The system of claim 1, wherein the amplifier bias controller is a tracking power supply and each control signal of the plurality of control signals is a supply voltage.

6. The system of claim 1, wherein the companion amplifier stage effectuates a first operating point based on the first control signal, wherein the main amplifier stage effectuates a second operating point based on the second control signal, and wherein the companion amplifier stage, when operating at the first operating point, has distortion characteristics similar to the main amplifier stage when operating at the second operating point.

7. The system of claim 1, wherein the predistortion signal loop comprises a main signal circuit and a feed forward signal circuit that comprises the companion amplifier stage, wherein the feed forward signal circuit samples the input signal to produce an attenuated input signal and modifies the attenuated input signal, using the companion amplifier stage, to produce a distortion signal comprising a distortion component introduced by the companion amplifier stage, wherein the feed forward signal circuit routes the distortion signal to the main signal circuit, wherein the main signal circuit produces the predistorted input signal based on the distortion signal and the input signal, and wherein the distortion component introduced by the companion amplifier stage is utilized to at least partially cancel a distortion component introduced to the amplified output signal by the main amplifier stage.

8. The system of claim 7, wherein the amplifier bias controller comprises a bias/switch controller.

9. The system of claim 8, wherein the main amplifier stage comprises:

a plurality of radio frequency (RF) amplifiers;

a signal splitter coupled between the predistortion signal loop and each RF amplifier of the plurality of RF amplifiers; and a plurality of switching devices, wherein each switching device of the plurality of switching devices is coupled between the signal splitter and an RF amplifier of the plurality of RF amplifiers and is further coupled to the amplifier bias controller, wherein at least one switching device of the plurality of switching devices is enabled based on the second control signal, and wherein the enabled switching device operably couples the corresponding RF amplifier to the signal splitter.

10. The system of claim 9, wherein the feed forward signal circuit further comprises a signal coupler that samples the input signal to produce the attenuated input signal and wherein the companion amplifier stage comprises:

a plurality of companion amplifier stage radio frequency (RF) amplifiers;

a companion amplifier stage signal splitter coupled between the signal coupler and each RF amplifier of the plurality of companion amplifier stage RF amplifiers; and a plurality of companion amplifier stage switching devices, wherein each switching device of the plurality of companion amplifier stage switching devices is coupled between the companion amplifier stage signal splitter and an RF amplifier of the plurality of companion amplifier stage RF amplifiers and is further coupled to the amplifier bias controller, wherein at least one switching device of the plurality of companion amplifier stage switching devices is enabled based on the first control signal, and wherein the enabled companion amplifier stage switching device operably couples the corresponding companion amplifier stage RF amplifier to the signal splitter.

11. The system of claim 8, wherein the main amplifier stage comprises:

a plurality of radio frequency (RF) amplifiers;

a signal splitter coupled between the predistortion signal loop and each RF amplifier of the plurality of RF amplifiers;

a signal combiner coupled to an output of each RF amplifier of the plurality of RF amplifiers; and a plurality of switching devices, wherein each switching device of the plurality of switching devices is coupled between the signal combiner and an RF amplifier of the plurality of RF amplifiers and is further coupled to the amplifier bias controller, wherein at least one switching device of the plurality of switching devices is enabled based on the second control signal, and wherein the enabled switching device operably couples the corresponding RF amplifier to the signal combiner.

12. The system of claim 11, wherein the feed forward signal circuit further comprises a signal coupler that samples the input signal to produce the attenuated input signal and wherein the companion amplifier stage comprises:

a plurality of companion amplifier stage radio frequency (RF) amplifiers;

a companion amplifier stage signal splitter coupled between the signal coupler and each RF amplifier of the plurality of companion amplifier stage RF amplifiers;

a companion amplifier stage signal combiner coupled to an output of each RF amplifier of the plurality of RF amplifiers; and a plurality of companion amplifier stage switching devices, wherein each switching device of the plurality of companion amplifier stage switching devices is coupled between the companion amplifier stage signal combiner and an RF amplifier of the plurality of companion amplifier stage RF amplifiers and is further coupled to the amplifier bias controller, wherein at least one switching device of the plurality of companion amplifier stage switching devices is enabled based on the first control signal, and wherein the enabled companion amplifier stage switching device operably couples the corresponding companion amplifier stage RF amplifier to the signal combiner.

13. The system of claim 7, wherein the input signal has a carrier component, wherein the attenuated input signal comprises a first attenuated input signal, wherein the companion amplifier stage amplifies the first attenuated input signal to produce a companion amplifier output signal having a carrier component and a distortion component, and wherein the feed forward signal circuit further comprises:
- a first gain and phase adjuster that receives a second attenuated version of the input signal and modifies at least one of a gain of the second attenuated version of the input signal and a phase of the second attenuated version of the input signal to produce an adjusted input signal;
- a signal combiner operably coupled to the companion amplifier stage and to the first gain and phase adjuster, wherein the signal combiner receives the companion amplifier output signal from the companion amplifier stage, receives the adjusted input signal from the first gain and phase adjuster, and combines the companion amplifier output signal and the adjusted input signal to cancel at least a portion of the carrier component of the companion amplifier output signal.

14. The system of claim 13, wherein the signal combiner comprises a first signal combiner that combines the companion amplifier output signal and the adjusted input signal to produce a distortion signal, wherein the feed forward signal circuit further comprises a second gain and phase adjuster operably coupled to the first signal combiner that receives the distortion signal and modifies at least one of a gain of the distortion signal and a phase of the distortion signal to produce an adjusted predistortion signal, and wherein the system further comprises a second signal combiner operably coupled to the second gain and phase adjuster that combines the adjusted predistortion signal and the input signal to produce the predistorted input signal.

15. The system of claim 1, wherein the companion amplifier stage comprises at least one radio frequency (RF) amplifier having a RF amplifying element coupled to an adjustable output load, wherein the main amplifier stage comprises at least one RF amplifier having a RF amplifying element coupled to an adjustable output load, wherein the companion amplifier stage utilizes the first control signal to adjust the output load of the companion amplifier stage RF amplifier, and wherein the main amplifier stage utilizes the second control signal to adjust the output load of the main amplifier stage RF amplifier.

16. The system of claim 1, wherein the companion amplifier stage comprises at least one radio frequency (RF) amplifier having a RF amplifying element and a first plurality of output loads, wherein the main amplifier stage comprises at least one RF amplifier having a RF amplifying element and a second plurality of output loads, wherein the companion amplifier stage utilizes the first control signal to select an output load from among the first plurality of output loads, and wherein the main amplifier stage utilizes the second control signal to select an output load from among the second plurality of output loads.

17. A method for linear amplification of an input signal having a carrier component to produce an amplified output signal, the method comprising steps of:
- envelope detecting the input signal to determine an envelope detector signal;
- generating a plurality of control signals based on the envelope detector signal;
- sampling the input signal to produce an attenuated input signal;
- amplifying, by a companion amplifier stage, the attenuated input signal to produce a companion amplifier output signal based on a first control signal of the plurality of control signals;
- generating a predistorted input signal based on the companion amplifier output signal, wherein the predistorted input signal comprises a distortion component introduced to the companion amplifier output signal by the companion amplifier stage; and
- amplifying, by a main amplifier stage and based on a second control signal of the plurality of control signals, the predistorted input signal to produce an amplified output signal, wherein the distortion component of the predistorted input signal at least partially cancels a distortion component introduced to the amplified output signal by the main amplifier stage.

18. The method of claim 17, wherein the step of amplifying the attenuated input signal further comprises a step of synchronizing the input signal to the first control signal.

19. The method of claim 17, wherein the step of amplifying the predistorted input signal further comprises a step of synchronizing the second control signal to the predistorted input signal.

20. The method of claim 17, wherein each control signal of the plurality of control signals is determined as a substantially quantized version of the envelope detector signal.

21. The method of claim 17, wherein the companion amplifier stage comprises a first radio frequency (RF) amplifier, wherein the main amplifier stage comprises a second RF amplifier, wherein the step of amplifying the attenuated input signal further comprises a step of effectuating a first operating point in the first RF amplifier based on the first control signal, wherein the step of amplifying the predistorted input signal further comprises a step of effectuating a second operating point in the second RF amplifier based on the second control signal, and wherein the first RF amplifier, when operating at the first operating point, has distortion characteristics similar to the second RF amplifier when operating at the second operating point.

22. The method of claim 21, wherein each control signal of the plurality of control signals is a supply voltage.

23. The method of claim 21, wherein each of the first RF amplifier and the second RF amplifier comprises a radio frequency (RF) amplifying element and an adjustable output load circuit, wherein the step of effectuating the first operating point in the first RF amplifier comprises a step of adjusting the output load circuit of the first RF amplifier based on the first control signal, and wherein the step of effectuating the second operating point in the second RF amplifier comprises a step of adjusting the output load circuit of the second RF amplifier based on the second control signal.

24. The method of claim 21, wherein each of the first RF amplifier and the second amplifier comprises a radio frequency (RF) amplifying element and a plurality of output load circuits, wherein the step of effectuating the first operating point in the first RF amplifier comprises a step of selecting an output load circuit from among the plurality of first amplifier output load circuits based on the first control signal, and wherein the step of effectuating the second operating point in the second RF amplifier comprises a step of selecting an output load circuit from among the plurality of second amplifier output load circuits based on the second control signal.

25. The method of claim 17, wherein the companion amplifier stage comprises a first plurality of radio frequency (RF) amplifiers, wherein the main amplifier stage comprises a second plurality of RF amplifiers, wherein the step of amplifying the attenuated input signal comprises steps of enabling at least one RF amplifier of the first plurality of RF amplifiers based on a first control signal of the plurality of control signals and amplifying, by the at least one enabled companion amplifier stage RF amplifier, the attenuated input signal to produce a companion amplifier output signal, and wherein the step of amplifying the predistorted input signal comprises steps of enabling at least one RF amplifier of the second plurality of RF amplifiers based on a second control signal of the plurality of control signals and amplifying, by the at least one enabled main amplifier stage RF amplifier, the predistorted input signal to produce an amplified output signal.

26. The method of claim 17, wherein the companion amplifier stage comprises a first plurality of radio frequency (RF) amplifiers, wherein the main amplifier stage comprises a second plurality of RF amplifiers, wherein the step of amplifying the attenuated input signal comprises steps of selecting at least one RF amplifier of the first plurality of RF amplifiers based on a first control signal of the plurality of control signals and amplifying, by the selected companion amplifier stage RF amplifier, the attenuated input signal to produce a companion amplifier output signal, and wherein the step of amplifying the predistorted input signal comprises steps of selecting at least one RF amplifier of the second plurality of RF amplifiers based on a second control signal of the plurality of control signals and amplifying, by the selected main amplifier stage RF amplifier, the predistorted input signal to produce an amplified output signal.

27. The method of claim 26, wherein each radio frequency (RF) amplifier of the first plurality of RF amplifiers and second plurality of RF amplifiers is coupled to a switching device, wherein the step of selecting at least one RF amplifier of the first plurality of RF amplifiers comprises a step of enabling a switching device coupled to at least one RF amplifier of the first plurality of RF amplifiers based on a first control signal of the plurality of control signals, and wherein the step of selecting at least one RF amplifier of the second plurality of RF amplifiers comprises a step of enabling a switching device coupled to at least one RF amplifier of the second plurality of RF amplifiers based on a second control signal of the plurality of control signals.

28. A wireless communication device comprising:

an information source that produces an input signal;

a transmitter operably coupled to the information source that comprises a companion amplifier stage, and a main amplifier stage, wherein the transmitter receives the input signal, samples the input signal to produce an attenuated input signal, modifies the attenuated input signal using the companion amplifier stage to produce a predistorted input signal comprising a distortion component, and amplifies the predistorted input signal to produce an amplified output signal, and wherein the distortion component of the predistorted input signal at least partially cancels a distortion component introduced to the amplified output signal by the main amplifier stage; and an antenna operably coupled to the transmitter that transmits the amplified signal.

29. The communication device of claim 28, wherein the communication device further comprises:

an envelope detector coupled to the information source that detects an envelope of the input signal;

a tracking power supply operably coupled to each of the envelope detector and the transmitter that produces a supply voltage based on the detected envelope of the input signal and conveys the supply voltage to each of the companion amplifier stage and a main amplifier stage; and wherein the companion amplifier stage modifies the attenuated input signal based on the supply voltage and the main amplifier stage amplifies the predistorted input signal based on the supply voltage.

30. The communication device of claim 28, wherein the communication device further comprises:

an envelope detector coupled to the information source that detects an envelope of the input signal;

a bias/switch controller operably coupled to each of the envelope detector and the transmitter that produces a plurality of control signals based on the detected envelope of the input signal and conveys a first control signal of the plurality of control signals to the companion amplifier stage and a second control signal of the plurality of control signals to the main amplifier stage; and wherein the companion amplifier stage modifies the attenuated input signal based on the first control signal and the main amplifier stage amplifies the predistorted input signal based on the second control signal.

31. The communication device of claim 30, wherein the companion amplifier stage comprises a first plurality of switching devices and a first plurality of radio frequency (RF) amplifiers, wherein each switching device of the first plurality of switching devices is coupled to an RF amplifier of the first plurality of RF amplifiers, wherein the main amplifier stage comprises a second plurality of switching devices and a second plurality of radio frequency (RF) amplifiers, wherein each switching device of the second plurality of switching devices is coupled to an RF amplifier of the second plurality of RF amplifiers, wherein at least one switching device of the first plurality of switching devices is enabled based on the first control signal, and wherein at least one switching device of the second plurality of switching devices is enabled based on the second control signal.

* * * * *